(12) United States Patent
Liu

(10) Patent No.: US 6,675,119 B1
(45) Date of Patent: Jan. 6, 2004

(54) IN-SITU MEASUREMENT METHOD AND APPARATUS IN ADVERSE ENVIRONMENT

(76) Inventor: Erzhuang Liu, 41 Bangkit Road, #11002, Singapore (SG), 679978

( * ) Notice: Subject to any disclaimer, the term of this patent is extended or adjusted under 35 U.S.C. 154(b) by 27 days.

(21) Appl. No.: 10/189,911

(22) Filed: Jul. 5, 2002

(51) Int. Cl.[7] .............................................. G01L 15/00
(52) U.S. Cl. .......................... 702/121; 73/431; 702/81
(58) Field of Search ...................... 73/431, 716; 62/3.3; 702/121, 122, 81, 127, 130, 131; 340/870.17; 324/765

(56) References Cited

U.S. PATENT DOCUMENTS

| | | | |
|---|---|---|---|
| 5,444,637 A | 8/1995 | Smesny et al. | 364/556 |
| 5,969,639 A | 10/1999 | Lauf et al. | 340/870.17 |
| 6,140,833 A | 10/2000 | Flietner et al. | 324/765 |

*Primary Examiner*—John Barlow
*Assistant Examiner*—Stephen J. Cherry
(74) *Attorney, Agent, or Firm*—George O. Saile; Stephen B. Ackerman

(57) ABSTRACT

A method and apparatus for making in situ measurements of process parameters in the adverse environment of manufacturing processes such as silicon wafer processing. Rather than using surrogate "smart wafers" that limit the ranges of processing parameters to those that allow the measuring circuitry to survive the process, the present method mounts, on the actual wafer, an enclosed, shielded apparatus in which the electronic circuitry is protected from the adverse effects of conditions such as high temperatures, electromagnetic radiation and plasmas. The wafer plus the mounted apparatus is then transported through the entire process cycle and measurements are made and recorded.

39 Claims, 1 Drawing Sheet

IN-SITU MEASUREMENT METHOD AND APPARATUS IN ADVERSE ENVIRONMENT

BACKGROUND OF THE INVENTION

1. Field of the Invention

The present invention relates generally to the design and use of measuring devices for manufacturing processes in which process parameters must be measured in situ and under the adverse environmental conditions encountered during actual process steps and, more specifically, to the design and use of such measuring devices in the field of semiconductor wafer processing.

2. Description of the Related Art

It is often necessary to make and record measurements of environmental and other parameters during the course of a variety of manufacturing processes in diverse fields. This is particularly true in the field of silicon wafer processing, where variations of physical and chemical parameters across the surface area of a wafer must be held within strict limits in order to insure high process yields. In wafer processing, for example, parameters such as wafer surface temperatures, wafer surface potentials and gas and fluid pressures and flow rates in wafer processing environments must be monitored and the monitoring process should, ideally, provide data that is both an accurate and a reliable function of time.

Unfortunately, the mechanisms for such monitoring are costly and subject to serious limitations. In the case of wafer processing, the processing environment is often characterized by extremes of temperature, the presence of highly reactive gases, fluids and plasmas, mechanical movements such as rapid spinning motions, electromagnetic radiation of various frequencies and intensities and a host of other factors, all of which can adversely affect the performance of sensing mechanisms. In addition, the interconnections between the sensors within the processing environment and the data recording and monitoring mechanisms in the outside world are themselves a problem, as small wires (for example) are fragile while heavy duty interconnects can perturb the system being measured. In the case of spinning wafers, the use of fixed wires is impossible. The frequent necessity of transporting the wafer between different processing areas also places severe limitations on the nature of interconnections.

Another serious problem is the type of sensors available and the manner in which they can be mounted on the wafers themselves. A fairly simple scheme for making temperature measurements involves the fastening of small "temperature dots" on the surface of a wafer. By means of a phase transition, these dots give an indication of the maximum temperature that they have been subjected to. Unfortunately, the resolution of the dots is poor and it is not possible to obtain a time resolved picture of the temperatures to which the wafer was subjected. Another approach to measuring temperatures involves the mounting of thermocouples to the surface of the wafer. While these are more accurate and can provide time resolution, they require a complex set of wires to an external monitoring station and such wires, as has already been noted, can be a problem.

Virtually all of the more flexible monitoring devices presently in use involve a wafer that is dedicated to process measurements, often called a "smart wafer." The sensing devices are fabricated directly on such a wafer and become a fixed and permanent part of it. Such fabrications often include complex integrated circuitry which is incapable of withstanding the rigorous environments to which actual wafers must be subjected before they themselves have device structures fabricated upon them. Thus, the measurements made by such a sensing wafer cannot adequately simulate the processes to which actual wafers are subjected. In short, such surrogate wafers limit the processes that can be monitored to those processes which the wafer can survive. The use of such smart wafers has been taught in the prior art described below.

Smesny et al (U.S. Pat. No. 5,444,637) provides a semiconductor wafer for sensing one or more processing conditions, such as pressure, temperature, fluid flow rate and gas composition, by placing an equivalent number of sensors within a plurality of regions spaced across the wafer.

Lauf et al. (U.S. Pat. No. 5,969,639) describes a wireless instrumented silicon wafer that can measure temperatures at various points and transmit the temperature data to an external receiver. Such an arrangement is of particular use in a spinning environment.

Flietner et al. (U.S. Pat. No. 6,140,833) provides a semiconductor wafer having at least one processed chip formed directly upon the wafer. The chip includes at least one sensor, a memory storage device, a timing mechanism for providing measured data as a function of time and a self contained power source.

All of the above provided methods and apparatus are subject to limitations imposed by the severity of the processing environment. In particular, at temperatures above 125° C. integrated circuitry will not function properly. Environments containing reactive gases and fluids also limit the application of smart wafers and a plasma environment will cause similar problems to those of reactive gases in addition to problems of electromagnetic interference. It is clear that a method and apparatus for in situ measurements is required that can be applied to actual wafers in actual processing environments. It is also clear that it would be highly advantageous if such a method can also be generalized for use in manufacturing processes other than silicon wafer processing. It is to these ends that the present invention is directed.

SUMMARY OF THE INVENTION

A first object of this invention is to provide a general method and apparatus for making in situ measurements of process parameters in the adverse environments of certain manufacturing processes.

A second object of the present invention is to provide a method and apparatus for making in situ measurements of an object being processed within an adverse environment wherein the measured parameters include mechanical movement, pressure, temperature, and radiation of various frequencies and intensities.

A third object of the present invention is to provide a method and apparatus for making in situ measurements of an object being processed in an adverse environment so that the measuring, data acquisition and data recording apparatus can reside within the process environment and be thermally insulated from it.

A fourth object of the present invention is to provide a method and apparatus for making in situ measurements of an object being processed in an adverse environment so that the measuring and data acquisition and recording apparatus can reside within the process environment and be electromagnetically insulated from it.

A fifth object of the present invention is to provide a method and apparatus for making in situ measurements of an object being processed in an adverse environment so that the measuring and data acquisition and recording apparatus can reside within the process environment and be isolated from the effects of reactive gases, fluids and plasmas.

A sixth object of the present invention is to provide a method and apparatus for making in situ measurements of an object being processed in an adverse environment so that the measuring and data acquisition and recording apparatus can reside within the process environment and be shielded from electromagnetic radiation of various frequencies and intensities as well as other forms of ionizing phenomena.

A seventh object of the present invention is to provide a method and apparatus for making in situ measurements of an object being processed in an adverse environment so that the measuring and data acquisition and recording apparatus can reside within the process environment and be directly mounted on the object being processed.

An eighth object of the present invention is to provide a method and apparatus for making in situ measurements of an object being processed in an adverse environment so that the appropriate sensors can be either fabricated directly on the object being processed or mounted on the object being processed.

A ninth object of the present invention is to provide a method and apparatus for making in situ measurements in an adverse environment so that said apparatus can be produced independently and used within the processing environment where and when required.

A tenth object of the present method is to provide an apparatus for making in situ measurements in an adverse processing environment so that said apparatus is self contained, lacks connecting cables and is of a size that permits it to be freely and easily transported throughout the entire processing environment.

An eleventh object of the present invention is to provide a method and apparatus for fulfilling all of the objects above that can be applied to the in situ measurement of silicon wafers during silicon wafer processing.

In accord with the objects of this invention there is provided a method and apparatus for in situ measurements, the apparatus in its general form, comprising:

a) a sensor or plurality of sensors that are in contact with the object to be measured either through mounting on or fabrication on said object;

b) a data acquisition system which may further comprise a power supply, a signal conditioning circuit, a microprocessor, a memory, an input/output (I/O) port and a heat sink and wherein a portion of the system may also act as a heat sink;

c) a support board formed of thermally insulating material and covered with radiation reflecting material, said support board providing mechanical support for the data acquisition system and also serving to isolate it from an encapsulating case;

d) a thermal insulation structure that decouples the support board from the encapsulating case and which may further comprise a suspension system;

e) an encapsulating case as already mentioned above, said case containing the data acquisition system, the support board and the thermal insulation structure and said case also providing a vacuum environment or equilibration with an external environment, protection from reactive gases, liquids and plasmas and shielding from external electromagnetic fields and radiation;

f) a plurality of electrical contact pads mounted on the exterior of said case and connected by internal conducting leads to the data acquisition system within the case.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying figures, wherein.

DESCRIPTION OF THE PREFERRED EMBODIMENT

The preferred embodiment of the present invention provides a method and apparatus for in situ measurements of process parameters within an adverse environment. The measuring apparatus is insulated from the adverse conditions of that environment, yet provides sensor contact to the object being processed and allows data acquisition and data processing of the sensor information obtained. The novelty of the method is that it does not involve the use of a surrogate object, such as a "smart wafer," that allows only a simulated process environment, but rather it allows direct sensor access to an processed object actually being processed, while isolating the measuring apparatus from the adverse effects of the process environment.

Figure 1A:
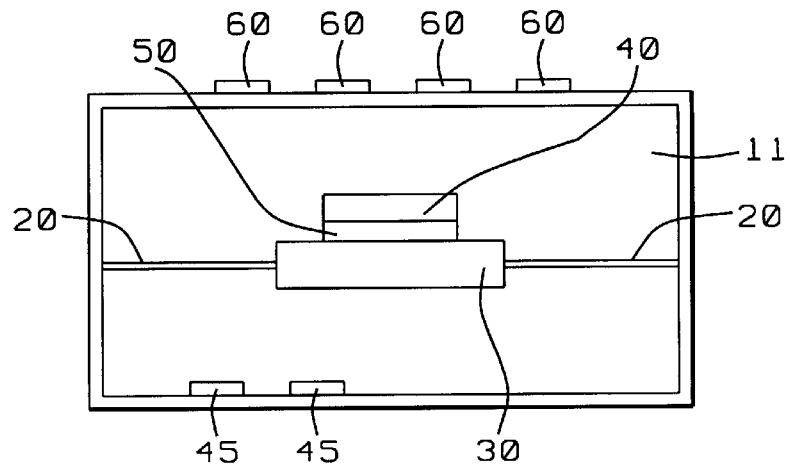
FIG. 1a is a schematic drawing of a side view the general form of the measuring apparatus.

Referring first to FIG. 1a, there is shown a schematic drawing of a cross-sectional side view of an apparatus that can be used to achieve the objects of the present invention in a general process setting. The apparatus comprises a case (10), which is of sufficient structural integrity to allow the formation and maintenance of a vacuum and which is fabricated of material that provides electromagnetic shielding. The region of the case shown as a void (11) may be a vacuum or may be filled with insulation material (such as commercially available aerogel) to achieve improved levels of thermal performance. Within the case, and connected to it internally by a suspension system (20), there is a support plate (30) for mechanically supporting the self-contained electrical circuitry (40) that acquires the measured data from the sensors (45) and processes it for analysis. It is understood that interconnects between the sensors and the associated circuitry (not shown in the figure) are also required. The power supply for the circuitry is typically a battery (50), which is mounted between the circuitry (40) and the support plate. (30) and serves, thereby, as an additional heat sink to protect the circuitry during processing. An additional heat sink (not shown in the figure) may also be employed to enhance thermal performance. The heat sink may be at any convenient position relative to circuit components. The support plate (30) is fabricated of thermally insulating material and is coated with a infra-red reflecting material such as gold. A plurality of electrically conducting contact pads (60) are mounted on the exterior portion of the case and allow data stored within the circuitry to be accessed by means of internal interconnects (not shown) that connect the pads to appropriate portions of the circuitry. A plurality of sensors (45) (two are shown) can be fabricated on, or attached to the object being measured (the object is not shown in the figure) and input data directly to the circuitry by interconnects as mentioned above. An advantage of this self-contained electromagnetically shielded and thermally isolated structure is that it allows the use of a wide range of sensors that might otherwise be adversely affected by the processing environment.

Figure 1B:
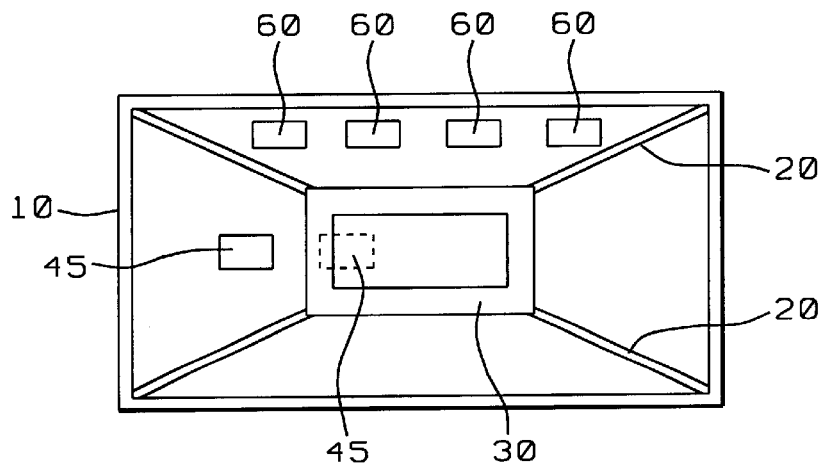
FIG. 1b is a schematic drawing of a top view of the general form of the measring apparatus.

Referring next to FIG. 1b, there is shown a schematic top view of the apparatus in FIG. 1a. In this top view the electrically conducting contact pads (60) can be seen as well as the suspension system (20) that holds the support plate (30) to the interior of the case (10). Two representative sensors (45), one is dashed because it is hidden beneath the circuitry, are also shown. It is noted once again that the apparatus depicted in this figure is only generically configured and is intended to illustrate the general approach of the method. It is to be understood that each specific manufacturing process and its associated processed part or parts will require a modification of the apparatus to most appropriately provide the measurements thereof. For example, many mechanical and optical parts require annealing as a stress relief mechanism before the parts are formed to their final shape or mounted in the appropriate apparatus. The temperature ramping up and ramping down profile is critical for proper part performance. The present method and apparatus can be advantageously used to monitor temperature vs. time for such processes. In such an embodiment of the present invention, the case would be sealed and the entire unit of sealed case and circuitry therein would be mounted on the part being annealed. The following figures will illustrate in greater detail a preferred embodiment of the method and apparatus appropriate to the specific case of silicon wafer processing.

Figure 2:
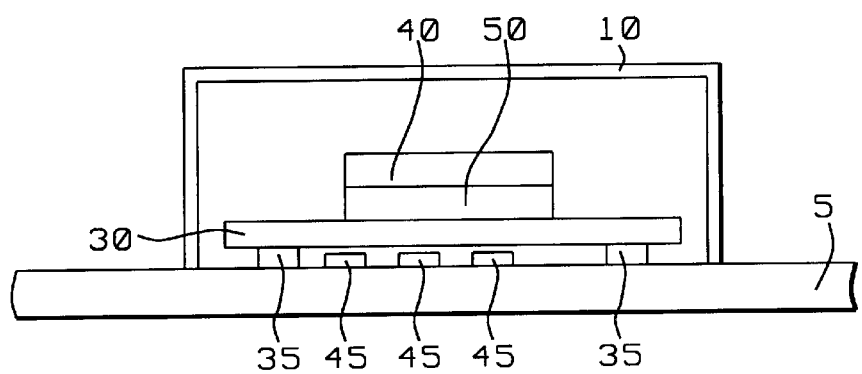
FIG. 2 is a schematic drawing of several views of a specific version of the apparatus that would be appropriate for measurements on a silicon wafer undergoing processing.

Referring next to FIG. 2, there is shown a schematic side view of the apparatus in a form appropriate for use in the measurement of a variety of process parameters during silicon wafer processing. A portion of the wafer (5) is shown, together with a plurality of process parameter sensors (45) which may either be fabricated directly on the wafer or merely mounted on the wafer (this distinction is not illustrated). The apparatus case (10) or housing is mounted over a portion of the wafer and contains within it a thermally and electromagnetically insulating support plate (30) to which is fastened the electrical circuitry used to acquire, process and store the measured data. The electromagnetically insulating property includes insulation from infra-red radiation which is accomplished by covering the support plate with a reflective gold film (not shown). The circuitry further comprises an integrated circuit (IC) module (40) which itself is fastened to a battery power supply (50) which serves also as a heat sink. An additional heat sink (not shown) may also be required to enhance the thermal performance of the device. The support plate is shown in this embodiment as resting on the silicon wafer using isolation pads (35), but the plate may also be fastened to the case by means of a suspension system as illustrated in FIG. 1a. The apparatus case (10) is formed of conducting material which is electrically in contact with the silicon wafer so as to electromagnetically shield the apparatus from fields generated during the process. The case can be fastened to the wafer using electronic grade cement, of which many varieties are commercially available. The apparatus case is also equipped with a plurality of vents (not shown) which can be adjusted to allow regulation of gases within the case relative to those outside of the case. These vents also allow the formation and maintenance of a vacuum if necessary. The apparatus also comprises electrical connecting pads formed on the exterior of the case, internal wiring from the pads to the IC and electrical connections to the sensors on the wafer. These are not shown in the figure. The entire apparatus is of sufficiently small size to allow it to be transported while on the wafer to various portions of the processing cycle. A simulation with such a structure has shown that it is capable of maintaining the temperature of the circuitry below 125° C. for five minutes while the silicon wafer is at 450° C.

As is understood by a person skilled in the art, the preferred embodiment of the present invention is illustrative of the present invention rather than limiting of the present invention. Revisions and modifications may be made to methods, materials, structures and dimensions employed in the present method and apparatus for in situ measurement of process parameters in an adverse environment while still providing a method and apparatus for in situ measurement of process parameters in an adverse environment in accord with the spirit and scope of the present invention as defined by the appended claims.

What is claimed is:

1. A method for making in situ measurements of process parameters during the processing of an object in an adverse environment, comprising:

providing an object to be processed in an adverse environment;

contacting a region of said object with a plurality of process parameter sensors;

mounting an apparatus on said object, said apparatus further comprising:

a shielded enclosure, said enclosure being filled with insulating material and also being provided with adjustable apertures for equalizing internal and external process pressures, for excluding external process gases or liquids and for forming and maintaining an internal vacuum;

an insulating support plate within said enclosure;

an isolating suspension system connecting said support plate to the interior of the shielded enclosure;

electrical circuitry mounted on said support plate, said circuitry comprising an input mechanism for acquiring sensor data, a mechanism for processing sensor data, a mechanism for storing sensor data and an output mechanism for exporting sensor data;

a power supply for supplying power to said electrical circuitry, said power supply also being mounted on said support plate and said power supply also serving as a heat sink;

a mechanism for connecting said electrical circuitry to said process parameter sensors;

electrical contacts mounted on the exterior of said shielded enclosure and connected internally to the output mechanism of the electrical circuitry, said contacts providing a mechanism for connecting said apparatus to an external analysis system;

processing said object, while said apparatus is mounted upon it.

2. The method of claim 1 wherein the process comprises a plurality of different processes, each of which may take place in its own environment.

3. The method of claim 1 wherein the adverse environment includes extremes of temperature that would adversely affect the performance of unprotected electrical circuitry.

4. The method of claim 1 wherein the adverse environment includes reactive gases and liquids whose presence would adversely affect the performance of unprotected electrical circuitry.

5. The method of claim 1 wherein the adverse environment includes gases and liquids at pressures that would adversely affect the performance of unprotected electrical circuitry.

6. The method of claim 1 wherein the adverse environment includes plasmas whose presence would adversely affect the performance of unprotected electrical circuitry.

7. The method of claim 1 wherein the adverse environment includes electromagnetic radiation whose frequency and intensity would adversely affect the performance of unprotected electrical circuitry.

8. The method of claim 1 wherein the adverse environment includes ionizing particles whose presence would adversely affect the performance of unprotected electrical circuitry.

9. The method of claim 1 wherein the adverse environment includes mechanical motions that would adversely affect the performance of unprotected electrical circuitry.

10. The method of claim 1 wherein the process parameter is temperature.

11. The method of claim 1 wherein the process parameter is pressure.

12. The method of claim 1 wherein the process parameter is the position or physical dimensions of the object being processed.

13. The method of claim 1 wherein the process parameter sensors are mounted on the object being processed.

14. The method of claim 13 wherein the apparatus is placed over the process parameter sensors.

15. The method of claim 1 wherein the process parameter sensors are fabricated on the object being processed.

16. The method of claim 15 wherein the apparatus is placed over the process parameter sensors.

17. The method of claim 1 wherein the process parameter sensors are contained within the apparatus.

18. The method of claim 1 wherein the apparatus is mounted on the object being processed using electrical grade cement.

19. The method of claim 1 wherein the object being processed is a silicon wafer.

20. An apparatus for making in situ measurements of process parameters in an adverse process environment comprising:
    a shielded enclosure, said enclosure being filled with insulating material and also being provided with adjustable apertures for equalizing internal and external process pressures, for excluding external process gases or liquids and for forming and maintaining an internal vacuum;
    an insulating support plate within said enclosure;
    an isolating suspension system connecting said support plate to the interior of the shielded enclosure;
    electrical circuitry mounted on said support plate, said circuitry comprising an input mechanism for acquiring sensor data, a mechanism for processing sensor data, a mechanism for storing sensor data and an output mechanism for exporting sensor data;
    a power supply for supplying power to said electrical circuitry, said power supply also being mounted on said support plate and said power supply also acting as a heat sink;
    process parameter sensors capable of contacting an object being processed;
    a mechanism for connecting said electrical circuitry to process parameter sensors;
    electrical contacts mounted on the exterior of said shielded enclosure and connected internally to the output mechanism of the electrical circuitry, said contacts providing a mechanism for connecting said apparatus to an external analysis system.

21. The apparatus of claim 20 wherein the shielded enclosure is electromagnetically shielded and excludes external electromagnetic radiation from its interior.

22. The apparatus of claim 20 wherein the shielded enclosure can exclude plasmas from its interior.

23. The apparatus of claim 20 wherein the support plate is formed of thermally insulating material.

24. The apparatus of claim 20 wherein the support plate is covered with material that reflects infra-red radiation.

25. The apparatus of claim 24 wherein the infra-red reflecting material is gold.

26. The apparatus of claim 20 wherein the isolating suspension mechanically and thermally isolates the support plate from the enclosure.

27. The apparatus of claim 26 wherein the isolating suspension comprises a plurality of wires that connect positions on the periphery of the support plate to positions on the interior of the insulating enclosure.

28. The apparatus of claim 20 wherein the power supply is a battery.

29. The apparatus of claim 28 wherein the battery is positioned between the electrical circuitry and the support plate and thereby acts also as an additional heat sink.

30. An apparatus for making in situ measurements of process parameters on a silicon wafer within the adverse environments of silicon wafer processing comprising:
    a shielded enclosure, said enclosure also provided with insulating material and with adjustable apertures for equalizing internal and external process pressures, for excluding external process gases or liquids and for forming and maintaining an internal vacuum and said enclosure being capable of electrically contacting the surface of a silicon wafer substrate;
    an insulating support plate within said enclosure;
    an isolating suspension system suspending the support plate above the surface of the silicon wafer substrate;
    electrical circuitry mounted on said support plate, said circuitry comprising an input mechanism for acquiring sensor data, a mechanism for processing sensor data, a mechanism for storing sensor data and an output mechanism for exporting sensor data;
    a power supply for supplying power to said electrical circuitry, said power supply also being mounted on said support plate;
    a mechanism for connecting said electrical circuitry to process parameter sensors;
    electrical contacts mounted on the exterior of said shielded enclosure and connected internally to the output mechanism of the electrical circuitry, said contacts providing a mechanism for connecting said apparatus to an external analysis system.

31. The apparatus of claim 30 wherein the shielded enclosure is fabricated of conducting material and excludes external electromagnetic radiation from its interior.

32. The apparatus of claim 31 wherein the shielded enclosure can exclude plasmas from its interior.

33. The apparatus of claim 30 wherein the support plate is formed of thermally insulating material.

34. The apparatus of claim 30 wherein the isolating suspension system comprises pads of thermally insulating material fastened to the underside of the support plate at various positions along its periphery, said pads thereupon making contact with the surface of the silicon wafer substrate and thereby allowing said support plate to rest on the surface of the silicon wafer substrate while not making thermal contact with it.

35. A method for making in situ measurements of process parameters of a silicon wafer during the adverse environmental effects encountered during silicon wafer processing comprising:

providing a silicon wafer;

contacting a region of the wafer with a plurality of process parameter sensors;

mounting an apparatus on said object, said apparatus further comprising:

a shielded enclosure, said enclosure being filled with insulating material and being also provided with adjustable apertures for equalizing internal and external process pressures, for excluding external process gases or liquids and for forming and maintaining an internal vacuum and said enclosure being capable of electrically contacting the surface of a silicon wafer substrate;

an insulating support plate within said enclosure;

an isolating suspension system suspending the support plate above the surface of the silicon wafer substrate;

electrical circuitry mounted on said support plate, said circuitry comprising an input mechanism for acquiring sensor data, a mechanism for processing sensor data, a mechanism for storing sensor data and an output mechanism for exporting sensor data;

a power supply for supplying power to said electrical circuitry, said power supply also being mounted on said support plate;

a mechanism for connecting said electrical circuitry to said process parameter sensors;

electrical contacts mounted on the exterior of said shielded enclosure and connected internally to the output mechanism of the electrical circuitry, said contacts providing a mechanism for connecting said apparatus to an external analysis system;

processing said silicon wafer while said apparatus is mounted upon it.

36. The method of claim 35 wherein the shielded enclosure is fabricated of conducting material and excludes external electromagnetic radiation from its interior.

37. The method of claim 35 wherein the shielded enclosure can exclude plasmas from its interior.

38. The method of claim 35 wherein the support plate is formed of thermally insulating material.

39. The method of claim 35 wherein the isolating suspension system comprises pads of thermally insulating material fastened to the underside of the support plate at various positions along its periphery, said pads thereupon making contact with the surface of the silicon wafer substrate and thereby allowing said support plate to rest on the surface of the silicon wafer substrate while not making thermal contact with it.

* * * * *